United States Patent [19]

Mizutani et al.

[11] Patent Number: 5,314,839
[45] Date of Patent: May 24, 1994

[54] SOLID STATE DEVICE FABRICATION METHOD INCLUDING A SURFACE TREATMENT STEP WITH A NEUTRAL PARTICLE BEAM WITH AN ENERGY BETWEEN 10EV AND 100EV

[75] Inventors: Tatsumi Mizutani, Tokyo; Takashi Yunogami, Fujimi; Kenetsu Yokokawa, Tokyo; Nobuyoshi Kobayashi, Kawagoe, all of Japan

[73] Assignee: Hitachi, Ltd., Tokyo, Japan

[21] Appl. No.: 756,274

[22] Filed: Sep. 6, 1991

[30] Foreign Application Priority Data

Sep. 12, 1990 [JP] Japan .................... 2-239823

[51] Int. Cl.$^5$ ............................. H01L 21/26
[52] U.S. Cl. ................... 437/173; 148/DIG. 76
[58] Field of Search ............... 437/173; 148/DIG. 76

[56] References Cited

U.S. PATENT DOCUMENTS

| | | | |
|---|---|---|---|
| 4,001,049 | 1/1977 | Baglin et al. | 437/173 |
| 4,474,829 | 10/1984 | Peters | 437/235 |
| 4,818,721 | 4/1989 | Wang | 437/22 |
| 4,868,104 | 9/1989 | Yonehara | 148/DIG. 122 |
| 4,902,647 | 2/1990 | Chutjian | 437/225 |

OTHER PUBLICATIONS

D. V. McCaughan, "Effects of bombardment by low-energy neutral particles on silicon dioxide films", J. Appl. Phys. 51(1) Jan. 1980, pp. 299-304.
S. Wolf, *Silicon Processing for the VLSI Era Volume 2: Process Integration*, Lattice Press, Sunset Beach, CA (1990) pp. 279-283.

*Primary Examiner*—Brian E. Hearn
*Assistant Examiner*—Linda J. Fleck
*Attorney, Agent, or Firm*—Fay, Sharpe, Beall, Fagan, Minnich & McKee

[57] ABSTRACT

To improve the characteristics of oxides and other insulators formed by conventional techniques, particularly to improve its density, relative dielectric constant, resistance to acid, resistance to reduction and other characteristics, and to provide solid state devices or socharacteristics, the surfaces of the silicon oxide insulator, or the like, is irradiated with electrically neutral particles.

45 Claims, 5 Drawing Sheets

SOLID STATE DEVICE FABRICATION METHOD INCLUDING A SURFACE TREATMENT STEP WITH A NEUTRAL PARTICLE BEAM WITH AN ENERGY BETWEEN 10EV AND 100EV

BACKGROUND OF THE INVENTION

The present invention relates to an insulator surface layer such as an oxide and a fluoride. The present invention further relates to solid state electronic devices having insulators.

A solid state electronic circuit such as a semiconductor integrated circuit is constructed of semiconductor material, metal, insulators, and other materials, which are processed into fine patterns and are stacked.

Insulators are often composed of a silicon oxide thin film or a thin film of amorphous structure containing boric acid, phosphorous and other elements, with silicon oxide as its main component. These thin films are usually formed as layers on a substrate (including directly on other layers that are on the substrate) by silicon thermal oxidation or chemical vapor deposition (CVD), plasma CVD, and sputtering deposition.

For example, an insulating film used for an insulator between metal wirings of a semiconductor integrated circuit often has a film of $SiO_2$ as its main component, which is formed by the CVD using a gas such as $SiH_4$ and $N_2$ or plasma CVD. The insulator film may be approximately 1 µm thick. Then, usually, subsequent to the formation of wiring via-holes, and other patterns by the lithographic process and etching process, the next layer which is a metal layer for wirings is stacked by the CVD method, sputtering deposition or the like, and through subsequent lithographic and etching processes, fine metal wirings are formed. In the stacked structure of a semiconductor integrated circuit formed in such a series of processes, rarely it has been attempted to improve intentionally the modification of the film quality of the surface insulator film layer or interlayer insulator film. The insulator film as deposited is used as it is.

Also, a silicon oxide thin film of 10-20 nm thick and mostly formed by thermal oxidation is used for the gate insulator film for the silicon MOS type transistor. In this case, too, the thin film is used as it has been deposited without any particular improving modification treatment for improving the property of the silicon oxide film significantly with the exception of the simple treatment of annealing.

As another example, there is a capacitor insulator film for a memory device of the memory integrated circuit and others, and in recent years, in order to intensify the electrostatic capacity thereof, the silicon oxide film is used in layers with the silicon nitride film having a large dielectric constant.

For the insulator film of a semiconductor integrated circuit as described above, the insulator film deposited by thermal oxidation, CVD or the like is used as it is without any particular surface treatment before the present invention.

A technique for forming an insulator film for a semiconductor integrated circuit is explained in detail in S. M. Sze ed, VLSI Technology, Second Edition (McGraw-Hill, New York, 1988) pp. 98-140 and 233-271, for example.

In the above-mentioned conventional technique, insulator films of $SiO_2$ and others are used as formed by thermal oxidation or CVD. In the case of the thermal oxidation formed $SiO_2$ film, its density is usually approximately 2.2-2.3 g/cm$^3$, for example, and it is known that such $SiO_2$ film is susceptible to transmission of molecules of $H_2O$, $O_2$, $H_2$ and others and atoms dissociated therefrom, which often leads to a problem that the oxidation, corrosion, and other degradations of the metal wirings are caused by the water and other molecules thus transmitted. In contrast, a $SiO_2$ film formed by plasma CVD is in general high in its density and is highly capable of preventing the transmission of water and other molecules. However, in the plasma CVD formed film, a considerable value of H is contained to often result in the film expansion, cracking, and production of other defectives due to the dissociation of the contained H at the time of thermal treatment.

Also, the relative dielectric constant of the $SiO_2$ film formed by silicon thermal oxidation and others is 3.9-4.0, and since this value is insufficient, a multi-layer film, in which the $Si_3N_4$ film or $Ta_2O_5$ film having a greater dielectric constant is stacked with the $SiO_2$ film, is used as an insulator film for the charge storage capacitor of the random access memory device. The dielectric constant of the $SiO_2$ film is small, and the capacity of the capacitor is also small when made by the $SiO_2$ film alone.

Further, the $SiO_2$ film is formed by thermal oxidation or CVD is easily etched by rare fluorine acid or its surface is reduced by the irradiation of H or rare gas ions, and tends to be Si rich.

SUMMARY OF THE INVENTION

An object of the present invention is to substantially improve the characteristics of oxides and other insulators formed by the conventional techniques set forth above for any of the above usages, particularly to improve its density, relative dielectric constant, resistance to acid, resistance to reduction and other characteristics, and to provide solid state devices or solid state materials such as those mentioned above having the characteristics improved by the present invention.

In order to achieve the above-mentioned object, the present invention irradiates onto the surfaces of the silicon oxide insulator, or the like, electrically neutral particles. With the irradiation of electrically neutral particles, it is possible to improve material properties, such as the density of the surface layer, chemical bond of surface atoms, dielectric properties and resistance to acid of the silicon oxide and other insulator compounds without modifying its surface chemical composition significantly. To this end, it is most desirable for the electrically neutral particles to possess a kinetic energy of several eV or more. Usually, a neutral beam of approximately 50 -1,000 eV should be used depending upon the chosen neutral atom. To generate such a neutral beam, the simplest and most effective system is to extract the ion beam having a desired energy from plasma, and using an apparatus such as shown in FIG. 5, the extracted beam is converted into the neutral beam by a charge exchange reaction. The charge exchange reaction is the electron transfer reaction between the particles, and the ion neutralization results from the electron transfer between ions and neutral atoms or neutral molecules. Therefore, when the ion beam passes through a neutral gas, the neutral beam is generated by this reaction, and it is possible to obtain only the neutral beam by removing the charged particles such as residual ions in a magnetic field or in an electrostatic field.

Usually, as the neutral particle beam, oxygen, nitrogen, silicon and other elements constituting the insulator film may be used besides rare gases, such as neon, argon and krypton.

In order to use the insulator film in a solid state device, it is usually important to provide a heating treatment at 100° C. or more after the irradiation by the neutral beam or during the irradiation for forming a film that is microscopically even.

It is not necessary to limit the incident direction of the neutral particle beam irradiated onto the surface to one direction. The irradiation can be performed at various angles of incidence.

Particularly, when there is an irregularity on the surface of the irradiated substrate, it is necessary to arrange the incidence in various directions for obtaining an overall improving modification of the entire film effectively. For this purpose, it is effective to use an irradiating system having a plurality of neutral beam sources with the beam directions different from each other or to allow the specimen to be rotated or vibrated in the course of the irradiation.

BRIEF DESCRIPTION OF THE DRAWINGS

Further objects, features and advantages of the present invention will become more clear upon the following detailed description of preferred embodiments as shown in the drawing, wherein.

DETAILED DESCRIPTION OF THE PREFERRED EMBODIMENT

The improvement of the film quality of the insulator film by the irradiation of the neutral beam set forth above has been discovered by the inventors. Hereinafter, experimental results will be described.

Figure 8:
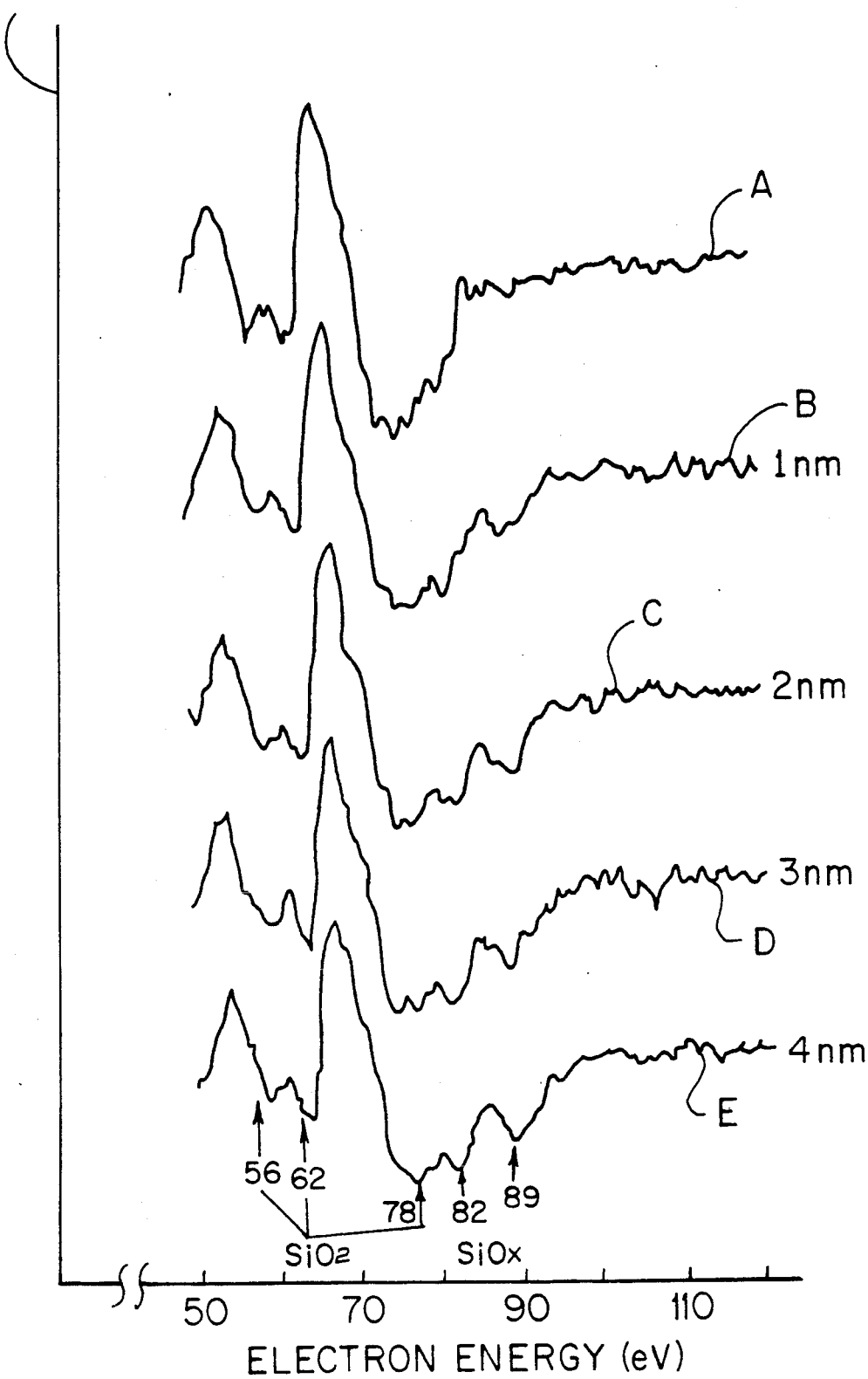
FIG. 8 is a view showing Auger spectra when the thermal oxidation film ($SiO_2$) on a silicon substrate is being sputter etched 1 nm by the ion beam.

FIG. 8 is a view showing the spectra of Auger electron spectroscopy (AES) analysis on a thermal oxide film ($SiO_2$) formed on a silicon (Si) substrate. As shown in FIG. 8, the Auger electron spectra corresponding to the Si in the $SiO_2$ are observed at 56, 62 and 78 eV. To this specimen, an $Ar^+$ ion beam of 3 KeV is irradiated, and the initial $SiO_2$ film of curve A was sputter etched in increments of depth of 1 nm to collect the Auger spectra of its surface sequentially for curves B, C, D, E that respectively represent an etching of 1 nm, 2 nm, 3 nm, 4 nm. From the results shown in FIG. 8, it is seen that new spectra appear at 82 eV and 89 eV in addition to the above-mentioned three spectra at 56 eV, 62 eV, and 78 eV, and the intensities of the new spectra at 82 eV and 89 eV become greater little by little from curve B through curve E. These new spectra at 82 eV and 89 eV appear because the suboxide SiOx ($x<2$) or the elemental Si which has been reduced completely is generated as a result of the reduction of the $SiO_2$ surface by the $Ar^+$ ion irradiation as described in Lang in Applied Surface Science, Vol. 37 (1989) pp. 63–77, and the Auger spectra at 82 eV and 89 eV correspond respectively to the SiOx and Si. $SiO_2$ no longer exists in the topmost surface layer; the spectra 56, 62, 78 are obtained from a greater depth.

However, it has been found by the inventors hereof that if the neutral beam of Ne is irradiated onto the $SiO_2$ surface in advance, the above-mentioned reduction reaction does not advance easily.

Figure 9:
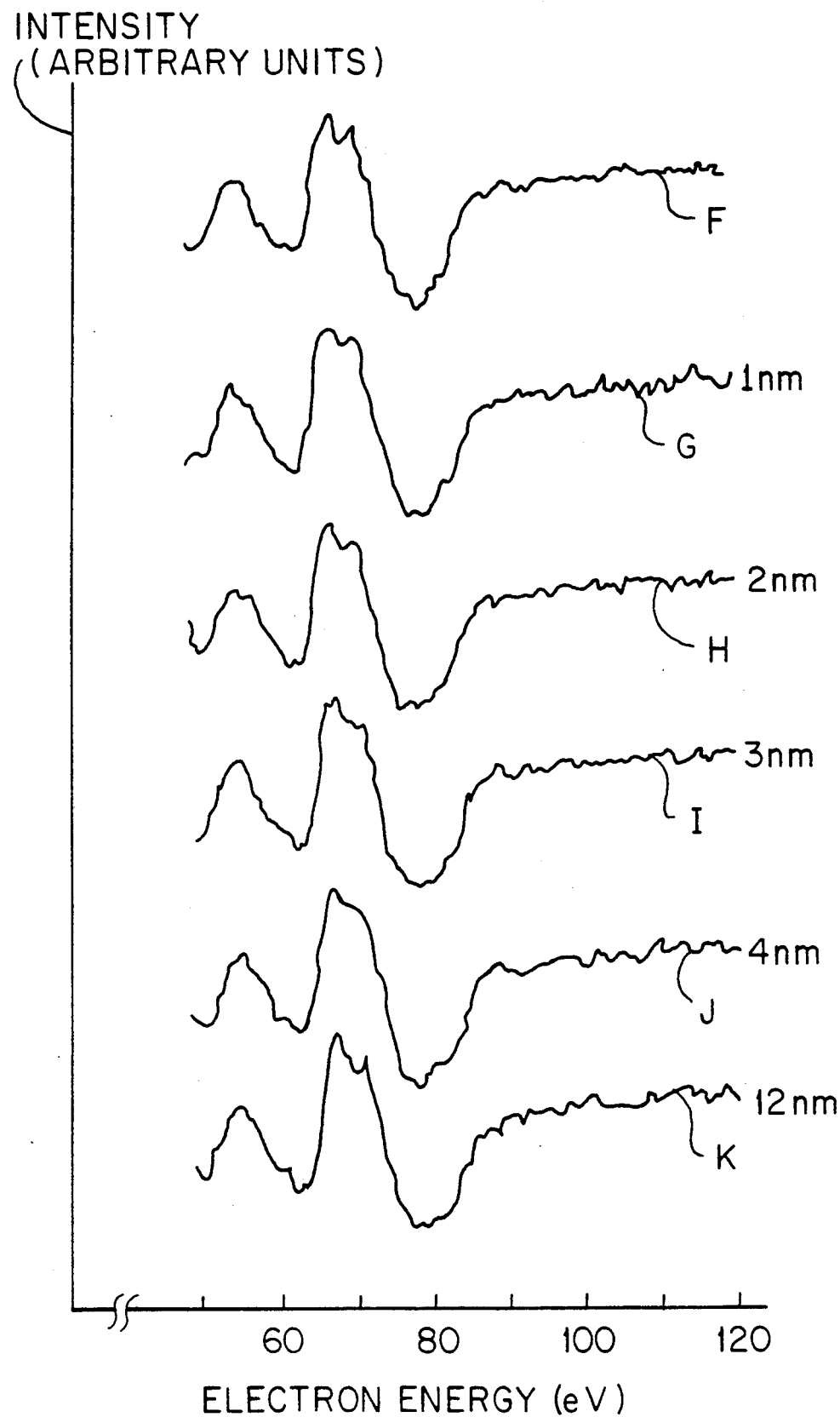
FIG. 9 is a view showing Auger spectra when a specimen of the above-mentioned thermal oxidation film, which is irradiated by the neutral beam of Ne, is being sputter etched by ion beams.

FIG. 9 is a view showing the Auger spectra of a substrate that is identical to the substrate of FIG. 8, except that the $SiO_2$ surface is irradiated by a neutral beam of Ne at 500 eV in an irradiation dosage of approximately $10^{17}/cm^2$ according to the present invention. Curves G-K represent $Ar^+$ ion beam etching depths of 1 nm, 2 nm, 3 nm, 4 nm and 12 nm, respectively. As shown in FIG. 9, the 82 eV and 89 eV spectra corresponding to the SiOx and Si do not appear when the etching is performed with the irradiation of the $Ar^+$ ion beam at 3 KeV. When the etching depth reaches 12 nm, the spectra in the vicinity of 80 eV expands at last. This appears to indicate that the SiOx ($x<2$) of 82 eV has appeared.

On the other hand, when the $SiO_2$ surface is irradiated, without the present invention, by the $Ne^+$ ion beam in $10^{17}/cm^2$ at 500 eV for the Auger analysis, the SiOx and Si Auger spectra appear immediately as in the case of the standard specimen shown in FIG. 8.

As the above shows, the $SiO_2$ surface layer has been modified in quality to have a more intensified resistance to reduction by the ion irradiation, as a result of the neutral beam irradiation according to the present invention.

The microscopic structure of such quality modification has not been clear as yet, but this modification is conjectured to be as given below.

When a particle having a kinetic energy of several 10 to several 100 eV collides against the solid state surface of the substrate, very high pressure occurs in the vicinity of the point of collision in an extremely short period of time, and at the same time, or with a slight time lag, a high-temperature state occurs, thus the modification of the solid state structure is implemented.

It is known that if silicon oxide is placed in a state of very high pressure of approximately 100K bar or more, the silicon oxide is densified, and it is known that such modification is irreversible often with phase transition accompanying the densification; under a very high pressure at a high temperature, the silicon oxide shifts to a phase having a high density and a high index of refraction such as coesite or stishovite. With the neutral irradiation of the present invention, there is a possibility that microscopically a similar phenomenon is taking place, and it is conjectured that the surface layer of the silicon oxide film has been densified.

Although the same densifying effect is probably obtainable with a known ion beam, as distinguished from the neutral beam of the present invention, it is not desirable to use the ion beam because the surface chemical composition changes significantly from the bulk composition due to the known fact that oxygen or halogen is released preferably from the surface layer when the charged particle of the ion beam is irradiated onto the oxide or halogenide, i.e., the known phenomenon of the so-called preferential sputtering for example is explained relative to FIG. 8. In the case of the neutral beam irradiation, such change in the composition rarely takes place as has been found by the inventors hereof according to their experiments and as shown in FIG. 9, and therefore the above-mentioned modification of the film quality is possible. Further, since an ion beam is charged, there is a disadvantage that if the specimen is an insulator film which is as thin as silicon oxide film, the degradation in breakdown field or insulator breakdown occurs.

Also, the use of a beam particle having a large atomic radius such as krypton and xenon is effective to improve the film quality evenly and more deeply. When the neutral beam of rare gas is irradiated, its energy should desirably be 100 eV or less because if it is more than several 100 eV, the rare gas is trapped in the film to spoil the evenness of the film. In order to promote the diffusion and emission to the outside of the surface, it is effective to heat the substrate surface to 100° C. or more during the irradiation.

In the case of the silicon oxide film irradiated by the neutral beam taken as an example, the refractive index of the surface layer of 5-10 nm depth of the silicon oxide film formed by the present invention is increased to 1.6-3.5 depending on the irradiation conditions, according to the measurements by an ellipsometer, and the results are found to be significantly high as compared with the refractive index of 1.46 for the silicon dioxide by usual thermal oxidation of silicon. Also, this silicon oxide film formed by the improving modification is high in its resistance to acid such as dilute hydrofluoric acid, and there have been some examples observed in which the etching rate is reduced by $\frac{1}{2}$-$\frac{1}{3}$. Furthermore, the dielectric constant is increased by 1.5-2 times that of the usual thermal oxidation film.

If the silicon oxide film having the characteristics set forth above is used as an insulator film between the wiring layers of a semiconductor integrated circuit, there has been observed a significant effect to prevent the selective deposition on this surface when a thin film of another material is deposited by CVD and other types of deposition, because the chemical stability of the surface is high.

Hereinafter, the embodiments of the present invention will be described in detail.

Embodiment 1

Figure 1:
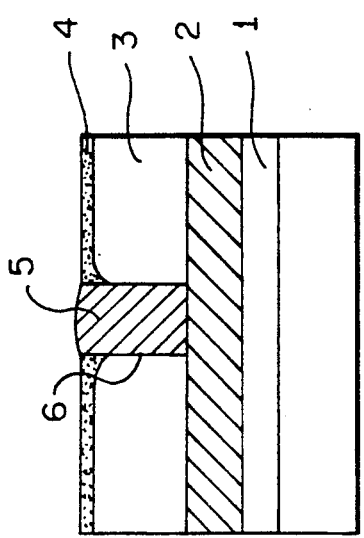
FIG. 1 is a view showing the present invention applied to modifying the surface of the interlayer insulator film for a semiconductor integrated circuit.
Figure 2:
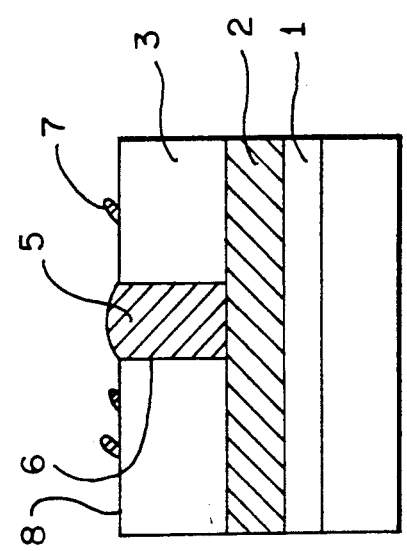
FIG. 2 is a view useful for explaining the present invention and illustrating the generation of granular metals on the silicon oxide film surface in chemical vapor deposition in the case where no surface modification treatment of the present invention is performed.

With reference to FIG. 1 and FIG. 2, the first embodiment is described. Although a film with the silicon oxide deposited by chemical vapor deposition (CVD) as its main component is used as the interlayer insulator film 3 in the multilayer wiring for a semiconductor integrated circuit, the processes given below are used for the connection between wirings for an integrated circuit of a very large scale integration, VLSI. At first, a fine via hole 6 is opened in the interlayer insulator film 3 by dry etching to expose the wiring surface of the lower metal layer 2, which is on a substrate 1. Since this via hole 6 is deep in general, hole filling metal 5 such as tungsten is first deposited by selective CVD to fill in only the fine via hole 6. At this juncture, it is utterly undesirable to deposit even a small quantity of tungsten metal on the remaining surface of the silicon oxide 3. Nevertheless, as shown in FIG. 2, an undesirable particle or granular tungsten 7 is often grown on the silicon oxide surface 8 of the interlayer insulator film 3 at the time of filling the via hole 6, to cause the yield of the subsequent wiring to be adversely affected. One of the reasons why this occurs is that the surface of the silicon oxide interlayer insulator film 3 is not sufficiently resistive to CVD gas such as tungsten fluoride or hydrogen, and the silicon oxide surface is locally reduced thereby to be the nucleus of the deposition of the granular tungsten 7.

Figure 7:
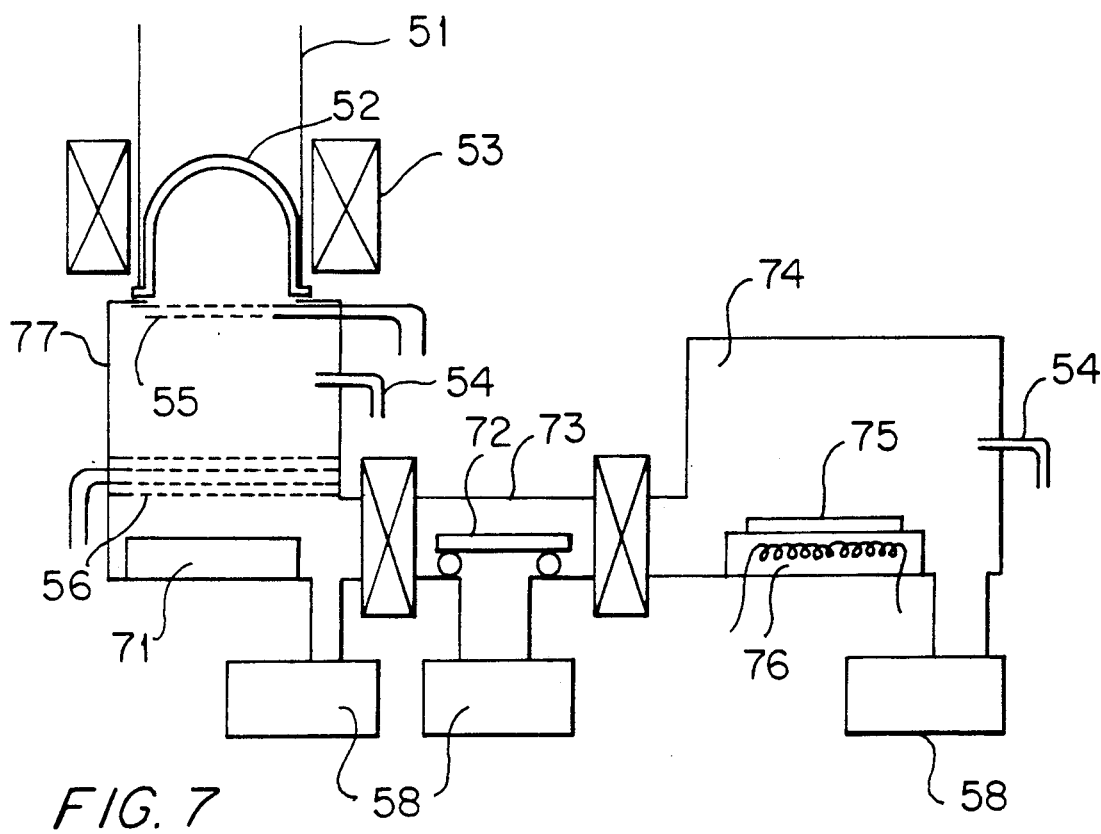
FIG. 7 is a view showing the thin film stacking apparatus in which an apparatus for performing a preparatory treatment of the neutral beam irradiation is added.

Therefore, for the purpose of applying the neutral beam of the present invention, an apparatus which generates a neutral beam of rare gas of several 10 eV to several 100 eV as a preparatory processing is added to the operation before the usual CVD apparatus 74 as shown in FIG. 7. Prior to the CVD of filling metal 5, an Ar neutral beam of 300 eV is irradiated onto the surface of the silicon oxide interlayer insulator 3 in the dosage of approximately $10^{17}/cm^2$ to form the surface modified layer 4. Subsequently, the selective deposition of tungsten filling metal 5 to the fine hole 6 is performed by CVD. As a result, the growth of the granular tungsten 7 is substantially controlled, i.e., prevented. The same effect is conspicuously observed in the case of irradiation by a neutral beam of other rare gases, such as Ne and Kr. Conceivably, these are the results of the enhancement of the chemical stability and resistivity to reduction of the modified surface layer 4 of the silicon oxide interlayer insulator film 3 by the irradiation of the neutral beam.

Also, by the above-mentioned neutral beam irradiation, the bottom of the fine hole 6 is cleaned. As a result, improvement of the contact condition between the hole filling metal 5 and the lower layer metal wiring 2 is effectively implemented at the same time.

Embodiment 2

Figure 3:
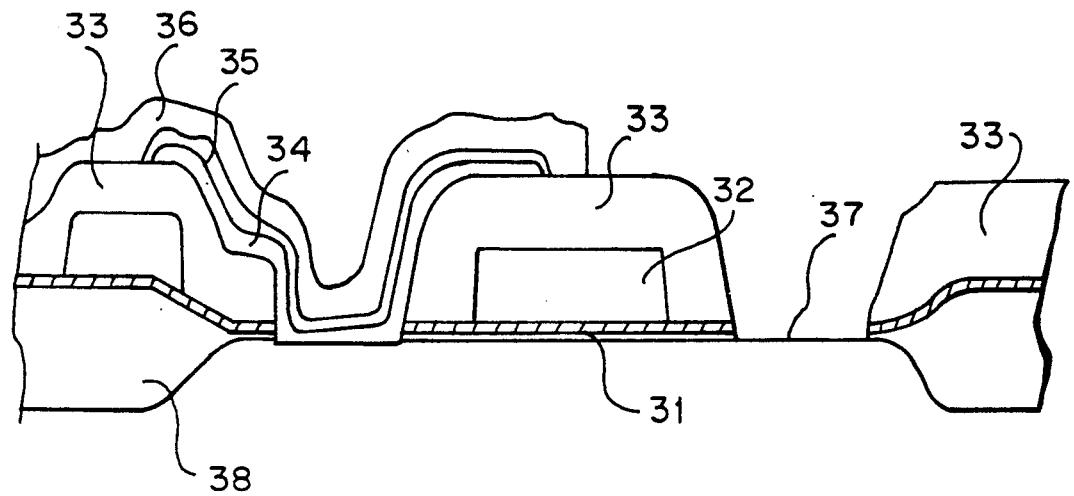
FIG. 3 is a cross-sectional view showing the structure of a semiconductor device having the gate insulator film according to the present invention.

FIG. 3 is a cross-sectional view illustrating the structure of an electronic solid state device. When the silicon oxide gate insulator film 31 for a silicon MOS type transistor is formed under an oxygen atmosphere of approximately $10^{-3}$ Torr, it is possible to improve the resistivity to an insulator breakdown field by 1.5-2 times that of the usual thermal oxidation film (39 of FIG. 4) by surface irradiation with a neutral beam of oxygen at the same time of or subsequent to the formation of silicon oxide gate insulator film 31. By the present invention, a device is produced with the gate insulator oxide film 31 that rarely causes breakdown due to charges. Thereafter, to complete the construction of the silicon MOS type transistor, after formation of the gate insulator film 31, the following structure is added. On top of the silicon oxide gate insulator film 31 after it has been provided with the modified surface layer according to the present invention, an insulator film 32 is formed and then covered with an insulator film 33. Thereafter, a polycrystalline film 34 is formed, covered by a capacitor insulator film 35, which is in turn covered by a polycrystalline silicon film 36. An electrode via hole 37 is formed to provide interlayer wiring, and the MOS device is then completed by providing such wiring and other conventional structure. The usual $SiO_2$ layer 38 is also provided.

Embodiment 3

The spin-on-glass film (SOG film) that is used as an insulator film between wiring layers of a semiconductor integrated circuit is low in density and porous. Therefore, the SOG film is high in its water transmissivity and absorption ability. Onto the surface of this SOG film surface, the Ar neutral beam of 300 eV–400 eV is irradiated in a dosage of $5 \times 10^{16}/cm^2$ by the present invention to improve the density of the SOG film surface layer. As a result, it is possible to reduce defects such as the expansion of the interlayer film which could conceivably result from absorbed water and other materials.

Embodiment 4

Figure 4:
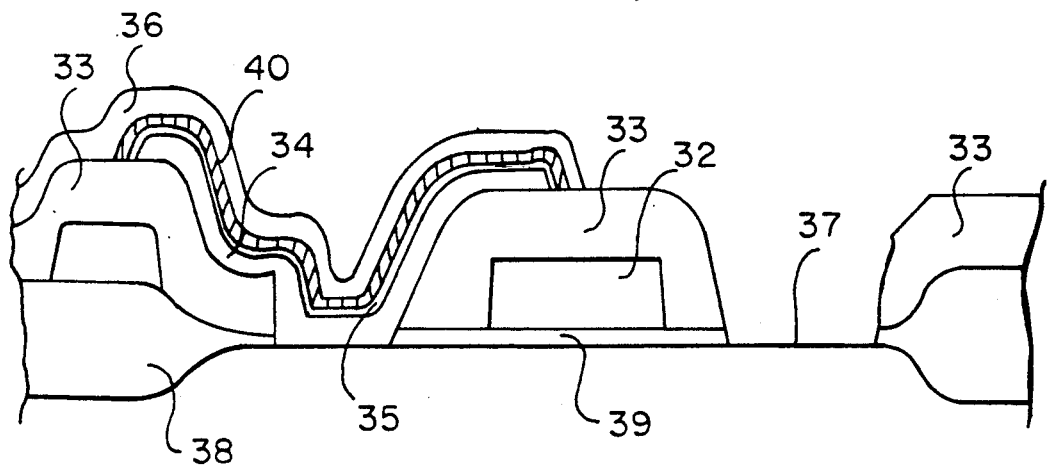
FIG. 4 is a cross-sectional view showing the structure of a semiconductor device having the capacitor insulator film modified according to the present invention.

FIG. 4 is a cross-sectional view showing the structure of a silicon MOS type transistor and memory capacitor unit of the type described with respect to FIG. 3. The capacitor insulator film 40 for the memory capacitor unit of this device is formed as described below. Subsequent to the formation of the polycrystalline silicon film 34 corresponding to one of the capacitor electrodes, the silicon oxide capacitor insulator film 35 of approximately 8 nm thick is formed by oxidizing the surface of the polycrystalline silicon film 34 in dry oxygen. Subsequently, by the use of an apparatus shown in FIG. 5, a neutral beam of Kr having an energy of approximately 100 eV is irradiated in the dosage of approximately $10^{16}/cm^2$. With this process, the surface layer 40 of the silicon oxide film 35 is densified to the modified state of a high dielectric constant. Subsequent to this, the polycrystalline silicon layer 36, which is the other electrode of the capacitor, is formed to construct the memory capacitor. The capacitance of the capacitor thus formed in accordance with the above-mentioned sequence of processes is increased by 1.5-2.0 times as compared with the capacitor of FIG. 3 that has not been treated by the neutral beam process of the present invention.

Figure 5:
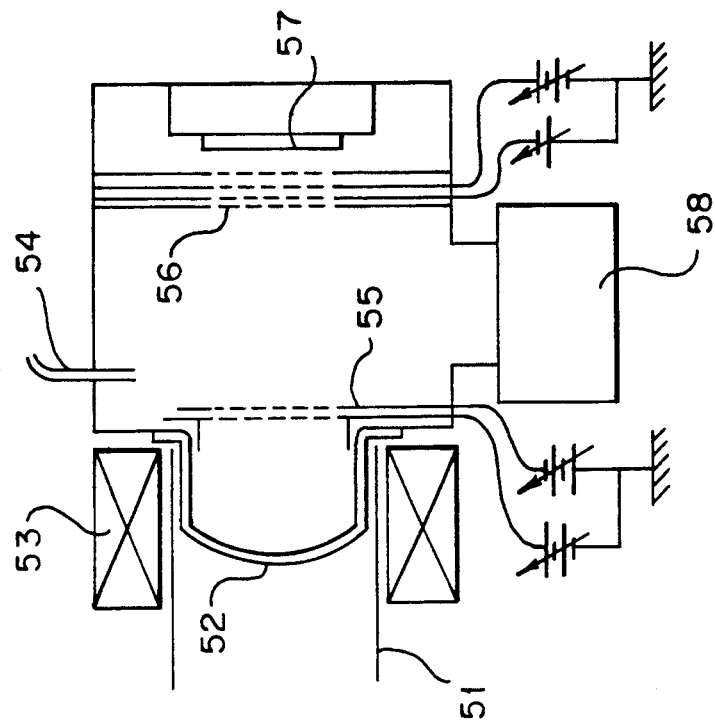
FIG. 5 is a schematic view showing a neutral beam irradiation apparatus used for the surface treatment method according to the present invention.

As shown in FIG. 5, a waveguide 51 for guiding microwave energy has plasma generated in a discharge tube 52 within the waveguide 51, which discharge tube 52 is surrounded by solenoid 53. Inlet tube 54 provides gas to the interior of the housing that provides a vacuum chamber for the substrate 57 upon which the modification of the present invention is performed. Electrical energy is provided to extraction electrodes 55, and thereby an ion beam of the gas is generated through the extraction electrodes 55 from the plasma generated with the microwave energy and the action of the solenoid coil. Charged particles are expelled by the grid 56 so that only the neutral beam is irradiated onto the substrate 57 while the chamber is evacuated by the vacuum pump 58.

Figure 6:
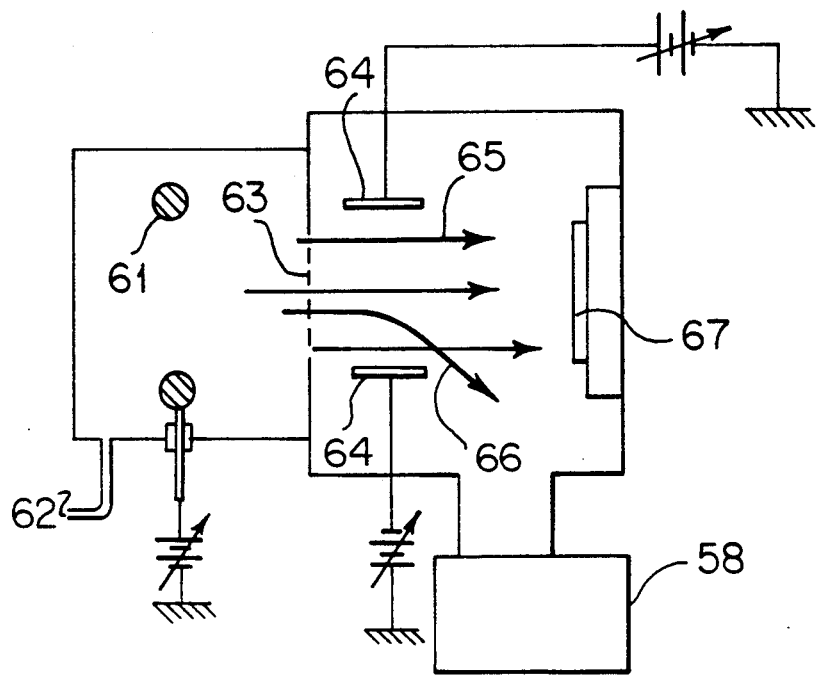
FIG. 6 is a schematic view showing another type of the neutral beam irradiation apparatus used for the surface treatment method according to the present invention.

In FIG. 6 there is shown a different apparatus for providing the neutral beam in performing the improved surface modification according to the present invention. Through an aperture 61, there is passed the gas to form the beam that is supplied from the gas supply inlet 62, and the first aperture 61 is formed between ion beam extraction electrodes provided with electrical energy to form an ion beam that travels through second apertures 63 to be directed toward the substrate 67. Charged particles or ions are removed by the deflection electrodes 64 that are provided with electrical energy as indicated so as to form the neutral beam 65; the charged particles or ions are deflected as ion beams 66 by the deflection electrodes 64 away from the substrate 67. Therefore, the substrate 67 is only irradiated with the neutral beam. As in the apparatus of FIG. 7, the vacuum pump 68 evacuates the chamber holding the substrate 67 during the irradiation with the neutral beam.

FIG. 7 contains much structure previously described. In addition, there is provided a substrate base 71 for holding the substrate during first neutral beam surface processing, a transporter 72 for transporting the substrate from the substrate base 71 through a joint 73 to a new base where the substrate 75 is contained within a chemical vapor deposition (CVD) apparatus 74. The housing 77 of the apparatus for neutral beam irradiation forms a vacuum chamber for the substrate on the substrate base 71 during irradiation, and a vacuum is pulled through the action of a vacuum pump 58. The joint 73 is also held at a vacuum by another vacuum pump 58, and the chemical vapor deposition apparatus 74 is held at a selected vacuum by still another vacuum pump 58. In this manner, the vacuums within housing 77 and chemical vapor deposition apparatus 74 may be held at different values according to the respective pumps 58 for simultaneously processing different substrates, and these two chambers are isolated from each other by appropriate valves separating them from the joint 73 that is held at a convenient selected vacuum by its own vacuum exhaust pump 58. Within the chemical vapor deposition apparatus, there is provided a gas supply inlet 54 and a heater 76.

In place of the apparatus shown in FIG. 5, a system called a McIlraith-type ion source shown in FIG. 6 may be employed. However, as the energy of the neutral beam generated by this later system is as great as 2 KeV or more, there is a disadvantage that the spoilage caused to the surface is great.

Embodiment 5

The preparatory neutral beam surface processing of this embodiment is conducted in the left-hand side of the thin film deposition apparatus of the present invention shown in FIG. 7 and described below.

Rare gas of Ar, Kr, or the like is induced from the gas inlet 54 and exhausted by a vacuum pump 58 to maintain the pressure in the vacuum chamber of housing 77 at $10^{-4}$–$10^{03}$ Torr. Microwave power is supplied through the waveguide 51 and magnetic field power is supplied by the coil 53 to generate plasma in the discharge tube 52. Then, an ion beam is generated through the extraction electrodes 55. By the function of the grid 56 to expel charged particles, only the neutral beam produced by the charge exchange reaction is irradiated onto the substrate mounted on the substrate base 71. The transporter for substrate transportation 72 transports the preparatorily neutral beam surface processed (irradiated) substrate to the chemical vapor deposition (CVD) apparatus 74 through the vacuum joint 73. Then, it is possible to deposit a thin film on the substrate 75 by CVD while heating the substrate to a desired temperature by the heater 76. Thereby the substrate surface is cleaned while undergoing the improved surface modification and transported under vacuum directly for CVD to minimize subsequent contamination.

According to the present invention, it is possible to enhance the density of the insulator film surface and control the refractive index, dielectric constant, and other characteristics by irradiating neutral particles onto the insulator film surface to effectively intensify the characteristics of its resistance to an insulator breakdown field, resistance to chemicals, resistance to acid, resistance to reduction, insulator characteristics and other characteristics. As a result, the reliability/life of a solid state device having these insulator films is improved.

In the descriptions set forth above, the improvement of the characteristics has been described in most cases for an insulator film having silicon oxide as its main component, but the present invention can be utilized effectively for the improving modification of the surface of a wide range of insulators such as aluminum oxide, silicon oxide and silicon oxide compound, and fluoride.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A surface treatment method, comprising:
projecting a neutral particle beam having kinetic energy of at least 10 eV and no more than 100 eV onto the surface of an oxide or fluoride sufficiently to enhance at least one of surface layer density, surface layer refractive index, surface layer dielectric constant, and surface layer resistance to reduction.

2. A surface treatment method according to claim 1, including forming the neutral particle beam from one of a charge exchange reaction and a McIlraith-type ion source.

3. A method of fabricating an electronic device, comprising:
providing a substrate;
forming and stacking thin films of semiconductor material, conducting metal and insulators in stacked relationship and in fine patterns to form an integrated circuit; and
prior to forming and stacking a film on an insulator film, irradiating the insulator film with a neutral particle beam having kinetic energy of at least 10 eV and no more than 100 eV sufficiently to alter density of the insulator film to a depth of at least 4 nm.

4. A surface treatment method according to claim 3, including forming the neutral particle beam from one of a charge exchange reaction and a McIlraith-type ion source.

5. The method of claim 3, including stacking the irradiated insulator film between electrode films to form a capacitor of a memory cell of a memory integrated circuit.

6. The method of claim 3, including stacking the irradiated insulator film as a gate insulator film for forming a MOS type transistor.

7. The method of claim 3, including forming the insulator film of a silicon oxide prior to said step of irradiating.

8. The method of claim 3, wherein said insulator film is formed to a thickness of not more than about 1 μm.

9. The method of claim 3, wherein said forming includes chemical vapor deposition of silicon.

10. The method of claim 3, wherein said forming includes plasma chemical vapor deposition of silicon.

11. The method of claim 3, wherein said forming includes sputtering deposition of silicon.

12. The method of claim 3, wherein said step of irradiating is conducted entirely in a vacuum chamber while evacuating to remove suspended materials, and said evacuating is continued at least until said step of stacking covers the irradiated surface of the insulator film with a film.

13. The method of claim 3, wherein said step of forming forms the insulator film as a silicon oxide film by thermal oxidation with a density of approximately 2.2–2.3 g/cm$^3$ and said step of irradiating densifies the silicon oxide film to a surface density of at last 2.4 g/cm$^3$.

14. The method of claim 3, wherein said step of forming forms the insulator film as a SiO$_2$ film by silicon thermal oxidation to have a relative dielectric constant of approximately 3.9–4.0 and wherein said step of irradiating changes the relative dielectric constant at least at the surface of the insulator film.

15. The method of claim 3, further including heating the irradiated surface of the insulator film during said step of irradiating to a temperature of at least 100° C.

16. The method of claim 3, wherein said step of forming forms the insulator film as a silicon oxide film by thermal oxidation of silicon; and said step of irradiating is conducted sufficiently, with respect to at least time and energy, to increase the refractive index of the irradiated surface of the insulator film to a depth of at least 5 nm by at least 0.14.

17. The method of claim 3, wherein said step of forming forms the insulator film as a silicon oxide film by thermal oxidation of silicon; and said step of irradiating is conducted sufficiently, with respect to at least time and energy, that the etching rate of the insulator film is reduced by at least one third.

18. The method of claim 3, wherein said step of forming forms the insulator film as a silicon oxide film by thermal oxidation of silicon; and said step of irradiating is conducted sufficiently, with respect to at least time and energy, that the dielectric constant of the insulator film is increased by at least 1.5 times.

19. The method of claim 3, further including forming the insulator film as a silicon oxide film on an electrically conductive film prior to said step of irradiating;
forming a fine via hole in and through the silicon oxide film to the electrically conductive metal film;
thereafter conducting said step of irradiating; and
thereafter selectively depositing tungsten metal on the electrically conductive metal and in the fine via hole.

20. The method of claim 3, including forming by thermal oxidation the insulated film as a silicon oxide gate of a silicon MOS type transistor; and thereafter conducting said step of irradiating sufficiently, with respect to at least time and energy that the resistivity of the insulator film to an insulator breakdown field is increased by at least 1.5 times.

21. The method of claim 3, including forming the insulator film as a silicon oxide capacitor insulator film on a polycrystalline silicon film by oxidizing the surface of the polycrystalline silicon film;
thereafter conducting said step of irradiating;

thereafter depositing a polycrystalline silicon film on the irradiated surface of the insulator film to form a capacitor of a memory cell of an integrated circuit memory; and wherein said step of irradiating is conducted sufficiently, with respect to at least time and energy of the neutral particle beam, to increase the capacitance of the capacitor by at least 1.5 times.

22. The method of claim 3, further including forming the insulator film of silicon dioxide; and
conducting said step of irradiating sufficiently, with respect to at least time, density and energy of the neutral particle beam, so that spectra of the insulator film corresponding to SiOx (x being <2) and Si is reduced to at least a depth of 4 nm in the irradiated surface.

23. The method of claim 3, further including forming the insulator film of silicon dioxide; and
conducting said step of irradiating sufficiently, with respect to at least time, density and energy of the neutral particle beam, so that spectra of the insulator film corresponding to SiOx (x being <2) and Si is reduced to at least a depth of 12 nm in the irradiated surface.

24. A method of fabricating an electronic device, comprising:
providing a substrate;
forming and stacking thin films of semiconductor material, conducting metal and insulators in stacked relationship and in fine patterns to form an integrated circuit, an wherein said forming forms a silicon oxide insulator film to a thickness of not more than 1 μm; and
prior to forming and stacking a film on an insulator film, irradiating the insulator film with a neutral particle beam having kinetic energy of at least 10 eV and no more than 100 eV sufficiently to increase density of the insulator film to a depth of at least 4 nm.

25. The method of claim 24, including stacking the irradiated insulator film between electrode films to form a capacitor of a memory cell of a memory integrated circuit.

26. The method of claim 24, including stacking the irradiated insulator film as a gate insulator film for forming a MOS type transistor.

27. The method of claim 24, wherein said step of irradiating is conducted entirely in a vacuum chamber while evacuating to remove suspended materials, and said evacuating is continued at least until said step of stacking covers the irradiated surface of the insulator film with a film.

28. The method of claim 27, further including heating the irradiated surface of the insulator film during said step of irradiating to a temperature of at least 100° C.

29. The method of claim 28, wherein said step of irradiating is conducted sufficiently, with respect to at least time and energy, that the etching rate of the insulator film is reduced by at least one third.

30. The method of claim 29, wherein said step of irradiating is conducted sufficiently, with respect to at least time and energy, that the dielectric constant of the insulator film is increased by at least 1.5 times; and
including conducting said step of irradiating sufficiently, with respect to at least time and energy that the resistivity of the insulator film to an insulator breakdown field is increased by at least 1.5 times.

31. The method of claim 29, including forming the insulator film on a polycrystalline silicon film by oxidizing the surface of the polycrystalline silicon film;
thereafter conducting said step of irradiating;
thereafter depositing a polycrystalline silicon film on the irradiated surface of the insulator film to form a capacitor of a memory cell of an integrated circuit memory; and
wherein said step of irradiating is conducted sufficiently, with respect to at least time and energy of the neutral particle beam, to increase the capacitance of the capacitor by at least 1.5 times.

32. The method of claim 28, further including conducting said step of irradiating sufficiently, with respect to at least time, density and energy of the neutral particle beam, so that spectra of the insulator film corresponding to SiOx (x being <2) and Si is reduced to at least a depth of 4 nm in the irradiated surface.

33. The method of claim 32, wherein said step of irradiating is conducted sufficiently, with respect to at least time an energy, that the etching rate of the insulator film is reduced by at least one third.

34. The method of claim 33, wherein said step of irradiating is conducted sufficiently, with respect to at least time and energy, that the dielectric constant of the insulator film is increased by at least 1.5 times; and
including conducting said step of irradiating sufficiently, with respect to at least time and energy that the resistivity of the insulator film to an insulator breakdown field is increased by at least 1.5 times.

35. The method of claim 33, including forming the insulator film on a polycrystalline silicon film by oxidizing the surface of the polycrystalline silicon film;
thereafter conducting said step of irradiating;
thereafter depositing a polycrystalline silicon film on the irradiated surface of the insulator film to form a capacitor of a memory cell of an integrated circuit memory; and
wherein said step of irradiating is conducted sufficiently, with respect to at least time and energy of the neutral particle beam, to increase the capacitance of the capacitor by at least 1.5 times.

36. The method of claim 24, wherein said step of forming forms the insulator film with a density of approximately 2.2–2.3 g/cm$^3$ and said step of irradiating densifies the insulator film to a surface density of at least 2.4 g/cm$^3$.

37. The method of claim 24, further including heating the irradiated surface of the insulator film during said step of irradiating to a temperature of at least 100° C.

38. The method of claim 24, wherein said step of irradiating is conducted sufficiently, with respect to at least time and energy, to increase the refractive index of the irradiated surface of the insulator film to a depth of at least 5 nm by at lest 0.14.

39. The method of claim 24, wherein said step of irradiating is conducted sufficiently, with respect to at least time and energy, that the etching rate of the insulator film is reduced by at least one third.

40. The method of claim 24, wherein said step of irradiating is conducted sufficiently, with respect to at least time and energy, that the dielectric constant of the insulator film is increased by at least 1.5 times.

41. The method of claim 24, further including forming a fine via hole in and through the insulator film to an electrically conductive metal film;
thereafter conducting said step of irradiating; and thereafter selectively depositing tungsten metal on the electrically conductive metal and in the fine via hole.

42. The method of claim 24, including conducting said step of irradiating sufficiently, with respect to at least time and energy that the resistivity of the insulator film to an insulator breakdown field is increased by at least 1.5 times.

43. The method of claim 24, including forming the insulator film on a polycrystalline silicon film by oxidizing the surface of the polycrystalline silicon film;

thereafter conducting said step of irradiating;

thereafter depositing a polycrystalline silicon film on the irradiated surface of the insulator film to form a capacitor of a memory cell of an integrated circuit memory; and wherein said step of irradiating is conducted sufficiently, with respect to at least time and energy of the neutral particle beam, to increase the capacitance of the capacitor by at least 1.5 times.

44. The method of claim 24, further including conducting said step of irradiating sufficiently, with respect to at least time, density and energy of the neutral particle beam, so that spectra of the insulator film corresponding to SiOx (x being <2) and Si is reduced to at least a depth of 4 nm in the irradiated surface.

45. The method of claim 44, wherein said step of irradiating reduces the spectra to at least a depth of 12 nm in the irradiated surface.

* * * * *